United States Patent [19]

Dydyk

[11] 4,457,022
[45] Jun. 26, 1984

[54] TWO DIODE IMAGE REJECTION AND PSEUDO-IMAGE ENHANCEMENT MIXER

[75] Inventor: Michael Dydyk, Scottsdale, Ariz.

[73] Assignee: Motorola Inc., Schaumburg, Ill.

[21] Appl. No.: 372,586

[22] Filed: Apr. 28, 1982

[51] Int. Cl.$^3$ .......................... H04B 1/26; H04B 1/10
[52] U.S. Cl. .................................... 455/317; 455/319; 455/330; 455/302
[58] Field of Search ............... 455/302, 317, 326, 330, 455/332, 318, 319; 332/43 B

[56] References Cited

U.S. PATENT DOCUMENTS

| 3,159,790 | 12/1964 | Pratt | 455/326 |
|---|---|---|---|
| 3,515,993 | 6/1970 | Merriam | 455/326 |
| 3,634,768 | 1/1972 | Carpenter | 455/330 |
| 4,287,605 | 9/1981 | Dydyk | 455/330 |
| 4,355,420 | 10/1982 | Ishihara | 455/317 |

FOREIGN PATENT DOCUMENTS 1334587 10/1973 United Kingdom ............... 455/317

OTHER PUBLICATIONS

"Image-Cancelling Mixers", Electronics Letters, 7/13/72, vol. 8, No. 14.

Primary Examiner—Jin F. Ng
Attorney, Agent, or Firm—Eugene A. Parsons

[57] ABSTRACT

An image rejection and pseudo-image enhancement mixer wherein mixer diodes are coupled to a signal source through a power divider without resistor, to a local oscillator through directional filters and to mixer outputs through a quadrature coupler. A 90° phase shifter coupled between one diode and the power divider without resistor provides for phase cancellation of the pseudo-image signal, while the image signal is terminated at one output port and the desired signal is obtained at another output port of the quadrature coupler.

7 Claims, 5 Drawing Figures

TWO DIODE IMAGE REJECTION AND PSEUDO-IMAGE ENHANCEMENT MIXER

BACKGROUND OF THE INVENTION

This invention relates to image rejection and enhancement mixers and in particular to image rejection and pseudo-image enhancement mixers utilizing only two diodes.

A common problem for wide open receivers is to differentiate between a signal of interest and its image, an unwanted input frequency that arises from a source other than that to which the receiver is tuned. In narrow-band communication receivers, one approach to the image problem is to insert a filter in front of the mixer. However, when the RF bandwidth stretches across several octaves, only an electronically controlled preselector, such as a YIG filter, can be used to differentiate the image frequency. In addition, these filters are relatively expensive, increase the receiver's noise figure and offer rather sluggish tuning speeds, making it difficult to continuously monitor frequency agile radar signals.

Another approach to image rejection involves the use of a channelized mixer. The benefits of an image channelized mixer are twofold: they help a receiver operator identify whether a signal is a true signal or its image, and they can be used to reduce the image noise generated by an RF amplifier.

Another important aspect of channelizied mixers is their ability to properly handle intermodulation product. In general, the mixer is a nonlinear device, thus it generates harmonics of the input signals. Without proper RF filtering, harmonics of one signal can mix with a second input signal to produce an in-band spurious IF response. Even with a single input signal, harmonics of the input signal can interact with harmonics of the local oscillator signal and produce harmonically related intermodulation products with the IF bandwidth.

It is known that the conversion loss of a mixer can be made to approach zero if all the harmonic and intermodulation frequencies can be reactively terminated and properly phased. Where $f_{LO}$ is the local oscillator frequency and $f_{RF}$ is the frequency of the input signal, each modulation product, $mf_{LO} \pm nf_{RF}$, possesses some energy and represents loss unless converted back to IF frequency. It is practically impossible to properly control the impedances at each of the frequencies, especially when the mixer is to operate over a wide frequency range. Therefore, the primary aim is to reactively terminate and properly phase the $(2f_{LO}-f_{RF})$ intermodulation product, often incorrectly known as the image. If this pseudo-image cannot be well shorted or opened across the full band, then control of the other intermodulation products will do no good.

Although the $(2f_{LO}-f_{RF})$ intermodulation product frequency is identical to the frequency of the *image*, a major distinction exists, which has not been properly observed by many. The image is a potential, or in fact, an actual input signal. The $(2f_{LO}-f_{RF})$ pseudo-image is generated by the mixer diodes and, therefor, is not and logically cannot be an input signal to the mixer that generated it.

Channelized mixers are further considered below in connection with FIG. 1 and FIG. 2.

SUMMARY OF THE INVENTION

Accordingly it is an object of the present invention to provide a new and improved image rejection and pseudo-image enhancement mixer.

It is another object of the present invention to provide a new and improved image rejection and pseudo image enhancement mixer which is less expensive and yet more reliable than prior art devices.

Yet another object of the present invention is to provide a new and improve image rejection and pseudo-image enhancement mixer in which local oscillator and radiofrequency isolation is independent of the need to match mixer diodes.

A further object of the present invention is to provide a new and improved image rejection and pseudo-image enhancement mixer capable of local oscillator noise rejection by the selectivity of a directional filter.

An additional object of the present invention is to provide a new and improved image rejection and pseudo-image enhancement mixer offering, the ability to accept very wide bandwidth signals without concern for the degradation of the signal due to the image.

Among the advantages of the present invention are lower local oscillator power requirements and a lower required level of bias current where necessary, as in millimeter wave frequency applications.

These and other objects and advantages of the present invention will become apparent to those skilled in the art upon consideration of the accompanying specification, claims and drawings.

In order to attain the above mentioned and other objects the present invention comprises a modified power divider coupled to a phase shifter which is in turn coupled to a first directional filter. A second directional filter is separately coupled to the power divider. Each directional filter is coupled to a mixer diode and both mixer diodes are coupled to a quadrature coupler from which the output signal is taken and the image signal terminated. A local oscillator signal is supplied through a power divider coupled separately to said first and said second directional filters.

DESCRIPTION OF THE PREFERRED EMBODIMENT

Figure 1:
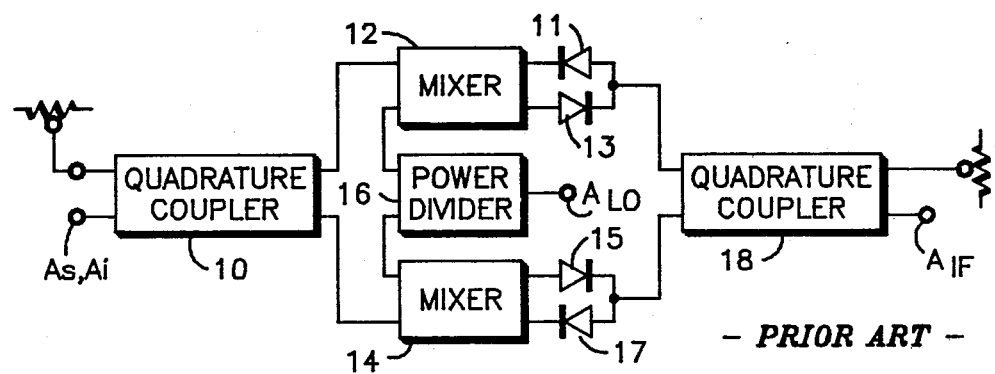
FIG. 1 is a block diagram of a first prior art structure.

As shown in FIG. 1, one prior art approach to the image rejection problem is to employ channelized mixers that inherently separate image and real frequencies. Such a prior art device comprises a pair of balanced mixers 12 and 14, having matched pairs of mixer diodes 11 and 13 and 15 and 17, respectively, a 90° quadrature coupler 10 and a power divider 16. A first input of coupler 10 is terminated as is a first output port of quadrature coupler 18. An input signal, As, along with an image signal $A_i$, may be applied to a second input port of quadrature coupler 18, a local oscillator signal $A_{LO}$, may be applied to an input of power divider 16, and a desired output signal at IF, $A_{IF}$, may be obtained from a second output port of quadrature coupler 18.

In the prior art device of FIG. 1, channelization is obtained using the pair of balanced mixers 12 and 14 the two 90° quadrature hybrids 10 and 18 and the in-phase power divider 16. The RF signal, $A_s$, is split by quadrature coupler 10 and fed into balanced mixers 12 and 14, so that the phase difference between the RF inputs of mixers 12 and 14 is 90°. The local oscillator signal, $A_{LO}$, is split by in-phase power divider 16. Hence, both mixers are driven in phase. The device shown in FIG. 1 relies on a resistive, in-phase power divider 16 to split the, local oscillators signal, LO, and resistively terminate the pseudo-image.

Alternately, the pseudo-image can be reactively terminated by using a reactive LO power divider. This process is commonly referred to as image recovery.

Figure 2:
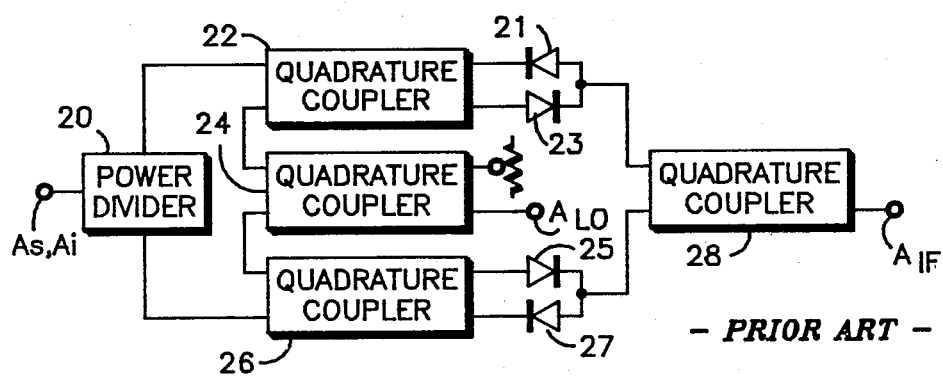
FIG. 2 is a block diagram of a second prior art structure.

As shown in the image recovery system of FIG. 2, the basic difference between channelized and an image recovery design is that the RF and LO input circuits are reversed; the RF input signal is fed into an in-phase resistive power divider 20 and the LO is fed into a Lange-type quadrature coupler 24 wherein the pseudo-image is reactively terminated.

Quadrature couplers 22 and 26 and their respective matched pairs of diodes 21 and 23 and 25 and 27 make up two balanced mixers. The pseudo-image generated by the set of mixer diodes 21 and 23 is opposite in phase to the pseudo-image generated by the set of diodes 25 and 27. This is the same as presenting a short circuit to each pseudo-image frequency and forcing it back through the mixer a second time to mix with the LO signal thereby reducing the overall conversion loss. The image frequency is again rejected through a resistively terminated port of an IF quadrature coupler 28.

Nevertheless, both of the devices of FIG. 1 and FIG. 2 involve significant conversion loss. Furthermore, the reduction of conversion loss achieved by the device of FIG. 2 is obtained by using 3 expensive RF quadrature couplers 22, 24 and 26, as opposed to the one RF quadrature coupler, 10, required for the device of FIG. 1.

Figure 3:
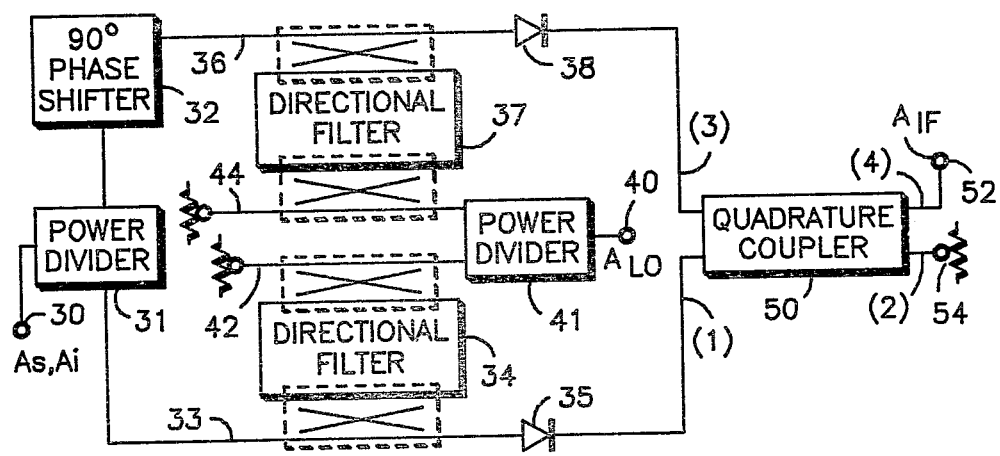
FIG. 3 is a block diagram of a preferred embodiment of the present invention.

FIG. 3 illustrates a preferred image rejection and pseudo-image enhancement mixer embodying the present invention in which a mixer input 20 is coupled to an input of a power divider without resistor 31, hereinafter referred to as a modified power divider, having a first output coupled in turn to an input of a phase shifter 32. A second output of modified power divider 31 is coupled by way of a transmission line 33 to a first directional filter 34 and to the anode of a first mixer diode 35. An output of phase shifter 32 is coupled by way of a transmission line 36 to a second directional filter 37 and to the anode of a second mixer diode 38.

A second mixer input 40 is coupled to a first input of a power divider 41. A first output of power divider 41 is coupled to directional filter 34 by way of a first resistively terminated transmission line 42 while a second output of power divider 41 is coupled to directional filter 37 by way of a second resistively terminated transmission line 44.

Figure 5:
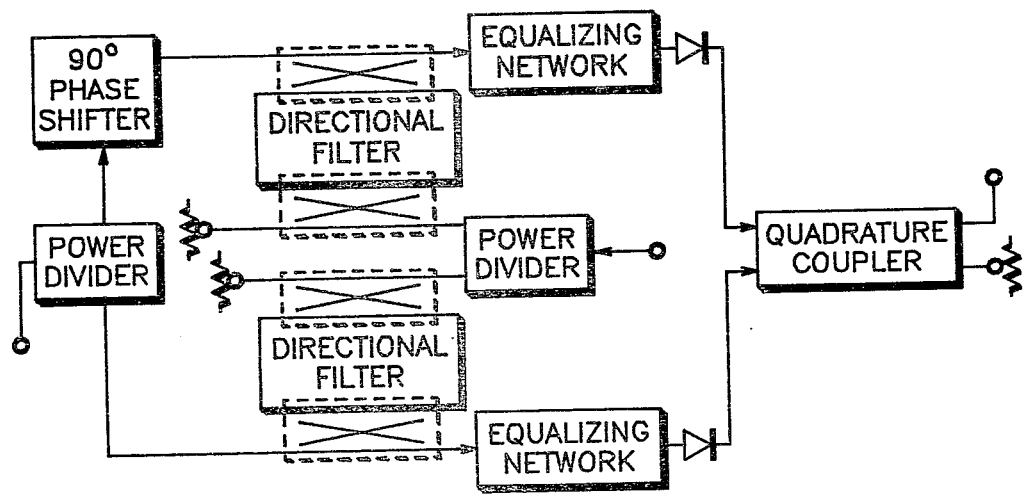
FIG. 5 is a block diagram similar to FIG. 3 of another slightly modified embodiment.

As is understood by one skilled in the art, an equalizing network may be introduced between directional filter 34 and diode 35 and/or between directional filter 37 and diode 38 in order to better match the diode to the transmitting system within the scope of the invention described herein. The embodiment described herein is illustrated in FIG. 5.

A quadrature coupler 50, having ports numbered (1), (2), (3) and (4) as shown in FIG. 3, is coupled by way of port (1) to a cathode of mixer diode 35 and is coupled by way of port (3) to the cathode of mixer diode 38. Quadrature coupler 50 is further coupled to a resistive termination 54 by way of port (2) and to a mixer output 52 by way of port (4).

Modified power divider 31 must comprise a power divider without a resistor, such as a Wilkinson power divider without resistor. On the other hand power divider 41 may comprise a power divider with or without a resistor, such as a Wilkinson power divider, as is suited to a particular application. Phase shifters, matched mixer diodes, directional filters, and IF quadrature couplers, such as quadrature coupler 50, are available to one skilled in the art and will not be discussed further.

Microstrip or stripline are the most desirable transmission media for realizing the mixer of the preferred embodiment. The present invention is applicable to other transmission media; however, planar transmission media are the most cost effective.

Turning now to the operation of the preferred embodiment, of FIG. 3 an input signal, containing desired signal component $A_s$ and image component $A_i$, is applied to mixer input 30. The input signal is divided in modified power divider 31 and channeled to produce an in-phase RF signal along line 33 to mixer diode 35 and a quadrature RF signal along line 36 to mixer diode 38 after a 90° phase shift in phase shifter 32.

Power divider 41 channels the local oscillator signal $A_{LO}$ applied to input 40 to directional filters 34 and 37. Directional filters 34 and 37 provide mixer diodes 35 and 38 with an in-phase local oscillator signal, isolate the RF and LO signal, and reduce the LO noise (by the selectivity of the directional filters).

Mixer diodes 35 and 38 each generate a pseudo-image signal at the image frequency in the direction of modified power divider 31. Phase shifter 32 provides the required phase differential so that the pseudo-image signals are 180° out of phase in modified power divider 31 thereby cancelling one another. Thus phase shifter 32 provides the required phase differential to virtually short circuit (or open circuit depending on the line length between the diodes, 35 and 38, and the junction of in-phase modified power divider 31) the pseudo-image frequencies.

Quadrature coupler 50 separates the desired and image frequencies. However, in the prior art devices of FIG. 1 and FIG. 2, the RF and LO signals are permitted to change to generate a constant IF signal. In the approach discussed in this disclosure, only the RF signal can be changed while the LO frequency is fixed. This, of course, generates a variable IF frequency.

The operation of the present invention can be demonstrated by performing a complete theoretical analysis of the mixer. This analysis begins by introducing a nonlinear transfer function of the mixing device which is expressed as:

$$i = A_0 + A_1 V + A_2 V^2 + A_3 V^3 + \quad (1)$$

where i and V are the device current and voltage, respectively, all other terms being constants. The applied voltage is a composite of an RF, local oscillator and image signals and is given by:

$$V = V_{RF} \cos\{\omega_{RF} t + 0\} + V_i \cos\{\omega_i t + \theta\} + V_{LO} \cos \omega_{LO} t \quad (2)$$

where:
V = total applied signal voltage
$V_{RF}$ = desired signal voltage
$\omega_{RF}$ = angular frequency of the desired signal
t = time
$\phi$ = phase angle of the desired signal
$\omega_i$ = angular frequency of the image signal
$V_{Lo}$ = local oscillator signal voltage
$\omega_{Lo}$ = angular frequency of the local oscillator signal
$\theta$ = the phase angle of the image signal.

The mixer output, after all higher frequency terms are eliminated, becomes:

$$V_{IF} = K \cos(\omega_{RF} t + \phi) \cos \omega_{Lo} t \tag{3}$$

$$V_{IF} = K' \cos(\omega_i t + \theta) \cos \omega_{Lo} t \tag{4}$$

where:
$V_{IF}$ = IF signal voltage
K, K' = constants
and where all other terms are as defined above.

The term $\phi$ in the equations above allows the effect of different input phases to be assessed.

Standard trigonometric manipulations on these equations produce terms containing the sum and difference intermediate frequency outputs. In most applications, the inputs are down-converted, producing generalized IF outputs of the form:

$$V_{IF1} = K'' \cos\{(\omega_{Lo} - \omega_{RF})t - \phi\} \tag{5}$$

$$V_{IF2} = K''' \cos\{(\omega_i - \omega_{Lo})t + \theta\} \tag{6}$$

where:
$V_{IF2}$ and $V_{IF2}$ = generalized output signal voltages
K'' and K''' = constants and where all other terms are as defined above.

Note that the coefficients of t in the cosine terms are chosen to be positive. This is done to maintain a consistent phase convention.

Application of these basic equations to the two diode mixer of FIG. 3, where $\phi$ is taken as 90 and $\theta$ is taken as 0 degrees, generates the following four signals:

$$V_{SIF(1)} = K'' \cos(\omega_{Lo} - \omega_{RF})t \tag{7}$$

$$V_{iIF(1)} = K''' \cos(\omega_i - \omega_{Lo})t \tag{8}$$

$$V_{SIF(3)} = K'' \sin(\omega_{Lo} - \omega_{RF})t \tag{9}$$

$$V_{iIF(3)} = K''' \sin(\omega_i - \omega_{Lo})t \tag{10}$$

where:
$V_{SIF(1)}$ = desired signal voltage at port (1)
$V_{SIF(3)}$ = desired signal voltage at port (3)
$V_{iIF(1)}$ = image signal voltage at port (1)
$V_{iIF(3)}$ = image signal voltage at port (3)
and where all other terms are as defined above.

Therefore, the input signal at port (1) of IF quadrature coupler 50 is $$V_1 = V_{SIF(1)} + V_{iIF(1)} \tag{11}$$

and the input signal at port (3) of coupler 50 is $$V_3 = V_{SIF(3)} + V_{iIF(3)}. \tag{12}$$

Application of scattering matrix analysis shows that the output at port (2), $V_{(2)}$, and the output at port (4), $V_{(4)}$, are:

$$V_{(2)} = \sqrt{2} K'' \sin(\omega_{Lo} - \omega_{RF})t \tag{13}$$

$$V_{(4)} = \sqrt{2} K''' \cos(\omega_i - \omega_{Lo})t \tag{14}$$

where all terms are as defined above.

The pseudo-image frequency is generated by the cubic term of the mixer diode transfer function, which produces an output of the form:

$$V_{pi} = K'''' \cos\{(2\omega_{Lo} - \omega_{RF})T - \phi_{pi}\} \tag{15}$$

where $V_{pi}$ is the pseudo-image signal voltage, $K''''$ is a constant, and $\phi_{pi}$ is the phase angle of the pseudo-image signal.

Comparing the pseudo-image outputs of the two diodes at modified power divider 31, it is established that they are opposite in phase when $\phi$ is made to be 90 degrees. This provides the desired effect of odd symmetry which is represented by a short circuit.

Thus the present invention accomplishes the image rejection of the devices of FIGS. 1 and 2 and the pseudo-image enhancement of the device of FIG. 2 with significantly less conversion loss because power in the pseudo-image signal is stored rather than dissipated. Furthermore, the replacement or elimination of costly RF couplers and diodes by less expensive parts in the present invention has the additional benefit of allowing RF and LO frequency isolation regardless whether the mixer diodes are matched. In addition the use of fewer diodes lowers the cost, lowers power requirements, and lowers dc bias current requirements while retaining the desired performance characteristics discussed above.

Figure 4:
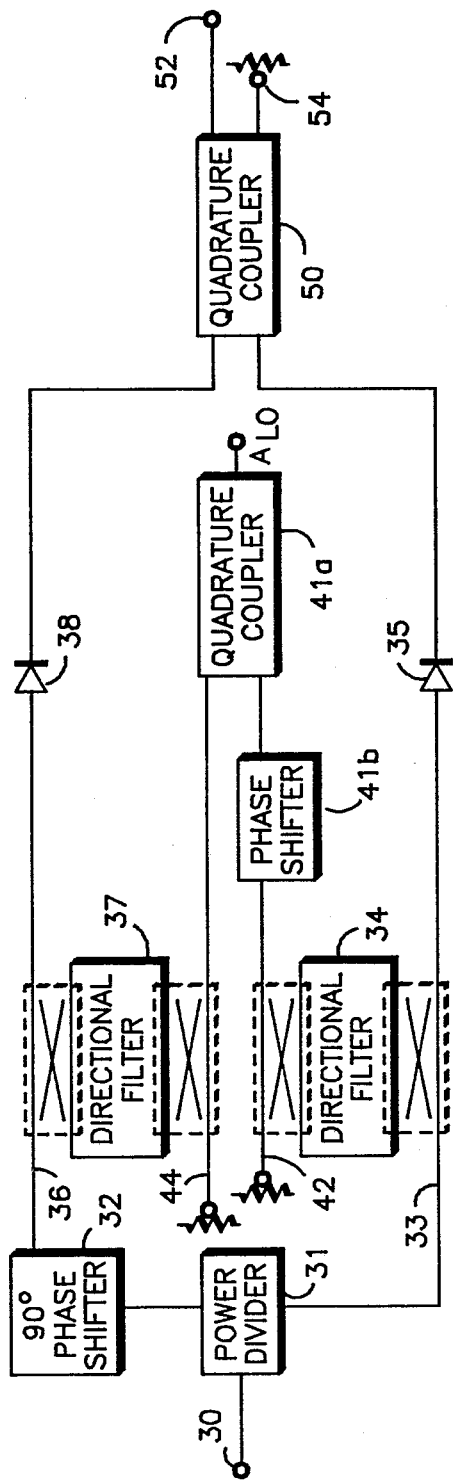
FIG. 4 is a block diagram similar to FIG. 3 of a slightly modified embodiment.

While the present invention has been described in terms of a preferred embodiment, further modifications and improvements will occur to those skilled in the art. For example, where useful to do so one skilled in the art understands that power divider 41 could be replaced by a quadrature coupler and a phase shifter as illustrated in FIG. 4. I desire it to be understood, therefore, that this invention is not limited to the particular form shown and I intend in the appended claims to cover all such equivalent variations which come within the scope of the invention as described.

I claim:
1. A mixer comprising:
a modified power divider having an input suitable for application of an RF signal having a first output and having a second output;
a phase shifter coupled to said first output of said modified power divider;
a first directional filter coupled to said phase shifter;
a second directional filter coupled to said second output of said modified power divider;
means for dividing the power of a local oscillator signal coupled to said first directional filter and coupled to said second directional filter;
a first diode coupled to said first directional filter;
a second diode coupled to said second directional filter; and
a quadrature coupler coupled to said first diode and coupled to said second diode, said quadrature coupler having an output suitable for supplying a signal.

2. The mixer as recited in claim 1 wherein said means for dividing the power of a signal comprises a Wilkinson power divider having a first output coupled to said first directional filter and having a second output coupled to said second directional filter.

3. The mixer as recited in claim 1 wherein said means for dividing the power of a signal comprises a modified power divider having a first output coupled to said first directional filter and having a second output coupled to said second directional filter.

4. The mixer as recited in claim 1 wherein said means for dividing the power of a signal comprises:
- a quadrature coupler having a first output coupled to said first directional filter and having a second output; and
- a phase shifter coupled to said second output of said quadrature coupler, said phase shifter having an output coupled to said second directional filter.

5. The mixer as recited in claim 1 wherein said mixer further comprises:
an equalizing network coupled between said first directional filter and said first diode.

6. The mixer as recited in claim 1 wherein said mixer further comprises:
an equalizing network coupled between said second directional filter and said second diode.

7. The mixer as recited in claim 1 wherein said mixer further comprises:
- an equalizing network coupled between said first directional filter and said first diode; and
- an equalizing network coupled between said second directional filter and said second diode.

* * * * *